United States Patent
Reykowski

(10) Patent No.: US 7,136,023 B2
(45) Date of Patent: Nov. 14, 2006

(54) ANTENNA ARRANGEMENT AND COUPLING METHOD FOR A MAGNETIC RESONANCE APPARATUS

(75) Inventor: Arne Reykowski, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 211 days.

(21) Appl. No.: 10/668,993

(22) Filed: Sep. 23, 2003

(65) Prior Publication Data

US 2004/0066195 A1  Apr. 8, 2004

(30) Foreign Application Priority Data

Sep. 23, 2002  (DE) ............... 102 44 173

(51) Int. Cl.
*H01Q 11/12* (2006.01)
*G01V 3/00* (2006.01)
(52) U.S. Cl. .............. 343/742; 343/867; 324/318
(58) Field of Classification Search ........... 343/742, 343/867; 324/318, 319, 322
See application file for complete search history.

(56) References Cited

U.S. PATENT DOCUMENTS

| 4,825,162 A | | 4/1989 | Roemer et al. ............. 324/318 |
| 5,430,378 A | * | 7/1995 | Jones ......................... 324/318 |
| 5,850,143 A | | 12/1998 | Schubert et al. ............ 324/318 |
| 6,323,648 B1 | * | 11/2001 | Belt et al. ................... 324/322 |

* cited by examiner

*Primary Examiner*—Michael C. Wimer
(74) *Attorney, Agent, or Firm*—Schiff Hardin LLP

(57) ABSTRACT

An antenna arrangement for a magnetic resonance device has a first antenna group, which includes at least one antenna element, and a second antenna group separated from the first antenna group, which likewise includes at least one antenna element. The antenna groups have respective cooperating coupler antenna parts that are fashioned and/or arranged such that, given a specific adjacent arrangement of the antenna groups with respect to one another, the coupler antenna parts form, by inductive coupling, a common boundary antenna element of the two antenna groups, which is inductively decoupled from the further antenna elements within the appertaining antenna groups. A corresponding method for coupling two antenna groups separated from one another employs such an antenna arrangement.

19 Claims, 4 Drawing Sheets

ANTENNA ARRANGEMENT AND COUPLING METHOD FOR A MAGNETIC RESONANCE APPARATUS

BACKGROUND OF THE INVENTION

1. Field of the Invention

The present invention concerns an antenna arrangement for a magnetic resonance apparatus of the type having a first antenna group, which comprises at least one antenna element, and a second antenna group, separate from the first antenna group, which likewise comprises at least one antenna element. The invention also concerns a method to couple two antenna groups that are separate from one another to acquire magnetic resonance signals, wherein the antenna groups each include at least one antenna element.

2. Description of the Prior Art

In the magnetic resonance examination of specific organs or body parts of a patient, surface antennas are increasingly used to receive the nuclear magnetic resonance signals (magnetic resonance signals). These surface antennas are arranged in the examination directly at the organ or body part of the patient to be examined, relatively close to the surface of the body. In contrast to larger antennas arranged farther from the patient that are normally used to generate an overall cross-section through a patient, these surface antennas have the consequent advantage of being able to be located closer to the region of interest. The noise component caused by the electrical losses within the body of the patient is thereby reduced, which causes the signal-to-noise ratio (SNR) of a surface antenna, in principle, to be better than that of a farther removed antenna. A disadvantage is that an individual surface antenna is only able to generate an effective image within a predetermined spatial dimension, which lies in the order of magnitude of the diameter of the conductor loop of the surface antenna. The possibilities for use of such individual surface antennas are therefore very limited, due to the restricted region of observation. The region of observation can be expanded, by enlarging the diameter of the conductor loop of the surface antenna, but the enlargement of the conductor loop causes the same with an increase in the aforementioned electrical losses in the body of the patient and, as a consequence the signals are received with an increased noise component. Given use of an individual surface antenna, a compromise path must always be made between the best possible resolution on and the largest possible region of observation.

It is possible to enlarge the region of observation without reducing the resolution to the same degree by using a number of individual surface antennas arranged adjacent to one another, i.e. an entire field of antenna elements, which together form a large surface antenna. A problem of such antenna arrangements with a number of adjacent antenna elements is that a high-frequency current in an antenna element can induce a voltage in an adjacent antenna element, due to inductive coupling. This means that a signal generated in one of the adjacent antennas automatically also causes a signal component in an adjacent antenna element. The inductive coupling consequently degrades the signal-to-noise ratio. In addition, the complexity in the evaluation of the signals from coupled antenna elements is greater than in non-coupled antenna elements. An inductive coupling of the antenna elements therefore should be avoided if possible.

A method to decouple adjacent antennas is disclosed in U.S. Pat. No. 4,825,162, for example. The decoupling is achieved by overlapping the conductor loops of adjacent antennas to a certain degree, such that overall the inductive coupling between the affected antennas is minimal. Due to the mandatory overlap between the involved antenna elements, this decoupling method is not suitable in all cases to decouple adjacent coils.

For example, one such case exists when the adjacent antennas belong to different antenna groups, for example various antenna arrays that are located in separate housings. In a magnetic resonance examination the size of the antenna should be adjusted to the size of the subject to be examined or to the type and the purpose of the examination, a number of different-sized surface antennas have to be available at a magnetic resonance device, with an antenna having the suitable size for a specific examination being selected. In order to limit the number of antenna sizes that must be left at hand, and in order to achieve a greater variability and better adaptation for various uses, antenna arrays are in practice frequently assembled in the form of modules. Each antenna module has a housing with an antenna group, including a number of individual antennas, which form a small antenna array. By joining the antenna modules, antenna arrays of different sizes can be fashioned. A problem is that the antenna elements of the joined antenna groups (that are respectively located at the ends of the antenna groups arranged to one another) are arranged in very close proximity to one another and therefore would inductively couple into one another.

Conventionally, the housings for the antenna groups are fashioned at the edges with fitting pieces, such that both adjacent edge antenna elements overlap, given a coupling of the housings. This is shown in FIG. 1. A first antenna group with a number of individual antenna elements A arranged in a first antenna plane $E^1$ is located in a first housing $G_1$. A second antenna group, which has a number of individual antenna elements A arranged in a second antenna plane $E_2$, is located in a further housing $G_2$. The ends of both housings $G_1$, $G_2$ are fashioned such that, given a coupling of the housings $G_1$, $G_2$ with an accurate fit, the edge antenna elements of both antenna groups inevitably overlap in a suitable manner in order to achieve a decoupling between the adjacent edge antenna elements. As FIG. 1 also shows, the individual antenna elements A of both antenna groups are respectively arranged in different antenna planes $E_1$, $E_2$. This means that one of the antenna groups has a larger separation from the patient than the other antenna group, such that the signal-to-noise ratio of this antenna group is in principle worse. In addition, the housings $G_1$, $G_2$ are each relatively thick, so that a predetermined safety spacing is maintained from the antenna group arranged next to the patient.

A simple placement, one atop the other, of antenna groups that are assembled in simple housings without the fitting piece ends would lead to a widening of the antenna arrangement in the overlap region. Such an arrangement is therefore possible in all cases in examinations in which the antennas are placed upon the patient, but not in arrangements in which the patient is placed upon the antennas.

FIG. 2 shows an alternative that also is presently used in practice to couple two antenna groups. Here the separation ensues between the different housings $G_1$, $G_2$ by means of a common boundary antenna whose conductor paths respectively terminate in a plug contact S at the edges of the housings G1, G2. Given coupling, both halves of the boundary antenna are electrically connected with one another via the plug contact S, such that overall a continuous antenna array is formed. A problem in the use of such plug connections is that the electrical contacts can foul and wear. In particular, it can also become a problem if fluid reaches the plug contact S, which cannot be completely ruled out in the medical field.

SUMMARY OF THE INVENTION

An object of the present invention is to provide an alternative to prior art arrangements as described above, which allows a secure and simple coupling of two adjacent antenna groups, and avoids the aforementioned disadvantages.

This object is achieved in an antenna arrangement according to the invention, which the antenna groups respectively have cooperating coupler antenna parts which are fashioned and/or arranged such that the coupler antenna parts, in a predetermined adjacent arrangement of the antenna groups relative to one another, couple with one another such that they form a common boundary antenna element which is inductively decoupled from the further antenna elements within the respective antenna groups. Both antenna groups or the housing in which the antenna groups are located therefore only need to be positioned relative to one another in the predetermined arrangement, and the coupling of both antenna groups automatically ensues via the integrated coupler antenna parts. Since the coupler antenna parts form a common antenna, at least one of the two-coupler antenna parts must have a suitable signal tap in order to tap the magnetic resonance signals received by the boundary antenna element.

The antenna groups preferably are designed such that, in the coupled arrangement, both antenna groups are substantially located in an antenna plane. Therefore, identical measurement relationships exist for all antenna groups, and a complex adaptation is not necessary in the data processing. Since both coupler antenna parts only inductively couple with each other, plug connections that could wear or foul are unnecessary.

The boundary antenna element formed from the coupler antenna parts preferably corresponds substantially to the remaining antenna elements of the antenna groups. In this case, the signal reception and further processing of the data received via this boundary antenna element can ensue in the same manner as with the remaining antenna elements of the antenna groups.

A capacitive component and/or an inductive component preferably is connected within at least one of the coupler antenna parts. By means of this component, the appertaining coupler antenna part is modified such that, in terms of the boundary antenna element isolated from the respectively adjacent antenna elements (i.e., without a presence of the adjacent antenna elements), the current on the appertaining coupler antenna part has in approximately the same value as the current on the other coupler antenna part, due to the inductive coupling of both coupler antenna parts. In both coupler antenna parts, the same current consequently flows in the coupled state and without influence by external antenna elements.

This is the case when the capacitance or inductance corresponds approximately to the reciprocal of the product of the square of the angular frequency of the magnetic resonance signal to be received and the difference of the inductance of the appertaining coupler antenna part and the coupler inductance between both coupler antenna parts. This means that, given a known magnetic resonance frequency, the optimal value of the capacitive or inductive component can be determined exactly, given a known inductance of the appertaining coupler antenna part as well as a known coupler inductance between both coupler antenna parts. However, neither the inductance of the coupler antenna part itself nor the coupler inductance between both coupler antenna parts can be exactly determined using the geometric data of the coupler antenna parts. Therefore, the suitable value of the capacitive or inductive component is determined such that both coupler antenna parts are considered in the design phase in the correct coupler position to one another and isolated from other antenna elements, and a variable capacitive or inductive component is adjusted until the desired value is found.

Furthermore, the coupler antenna elements preferably are fashioned and/or arranged (i.e., are configured) such that the coupler inductances of both coupler antenna elements are approximately as large terms of magnitude (in the optimal case, identical except for polarity) as an antenna element that is arranged directly adjacent to one of the coupler antenna elements. This means that both coupler antenna parts inductively couple to the same degree with an antenna element that is arranged adjacent to one of the coupler antenna parts. This requirement should be valid in both directions, i.e. the same coupling of both coupler antenna parts should exist with an antenna element that is adjacent to a first of the coupler antenna parts, and an identical coupling of both coupler antenna parts should be present with another antenna element that is adjacent to the other coupler antenna part.

If this requirement for identical strong coupling of the coupler antenna elements with the respective adjacent antenna elements is fulfilled, and in addition the appropriate capacitive or inductive component is connected in one of the coupler antenna parts, optimal conditions exist so that the coupled coupler antenna parts operate as a common antenna element, and simultaneously the inductive coupling to the adjacent antenna elements is minimal in both antenna groups.

Due to the lesser complexity, a capacitive or inductive component with a fixed value is used in the normal case within a serial production of the antenna arrangement, this fixed value having been determined in the design phase as the optimal value by varying an adjustable component. This is easily possible given suitable production quality with a high reproducibility. Alternatively, an adjustable component can be used in the production of the antenna arrangement, for example a controllable trim capacitor. In this manner, it is possible to readjust to component at any time given a change in other parameters influencing the coupling, for example by means of a control device of the magnetic resonance device, in order to adjust the optimal coupler requirements.

Both coupler antenna parts can in principle be assembled symmetrically, i.e. uniform. Alternatively, one antenna group can have a coupler antenna part of a first type, and the other antenna group can have a coupler antenna part of a second type. Both types of coupler antenna parts are then assembled such that only one coupler antenna part of the first type can be combined with a coupler antenna part of the second type. For example, coupler antenna part of the first type could have a suitable signal tap in order to tap the magnetic resonance signals received from the common formed boundary antenna element. The coupler antenna part of the second type this case could be, for example, the capacitive or inductive component, in order to adapt the above-cited condition to the current of the other coupler antenna part.

At least the coupler antenna part, which has no tap for the received magnetic resonance signals normally, can be completely galvanically contact-free. This means that the appertaining coupler antenna part is not grounded and has no galvanic contact at all to other components, rather it is only inductively coupled with the other coupler antenna part as well as with the adjacent antenna elements of the antenna groups.

The individual coupler antenna parts preferably are assembled such that their self-resonant frequency is detuned with regard to the frequency of the magnetic resonance signal to be received. This has the advantage that the respective coupler antenna parts are transparent for the transmission field and need not be detuned in the cases in which they are not necessary, i.e. when no further antenna group is coupled.

Since the coupler antenna parts coupled with one another should form an adequate antenna element, at least one of the coupler antenna parts (for example the coupler antenna part of the first type or the coupler antenna parts of the second type) has a tuning device. By means of this tuning device, the self-resonant frequency of the boundary antenna element can then be tuned, when used in the reception mode, to the frequency of the magnetic resonance signal to be determined in the coupled state of both coupler antenna parts, detuned with regards to the frequency of the magnetic resonance signal when used in the transmission mode. Alternatively, both coupler antenna parts can have a tuning device, this tuning device being activated in the event of coupling so as to bring the common formed boundary antenna element into corresponding resonance or to detune it.

In an alternative exemplary embodiment, at least one of the two coupler antenna parts includes an arrangement to bring the coupler antenna part to an operating condition in which the self-resonant frequency of the coupler antenna part can also be tuned, without a further coupled coupler antenna part, to the frequency of a magnetic resonance signal to be received. This means that the coupler antenna part can be switched on and off between an operating condition in which it operates merely as a part of the boundary antenna element, and a second operating condition in which it by itself forms a complete antenna element.

In a preferred design of the coupler antenna parts, they each have a first antenna section that proceeds substantially in an antenna plane formed by the antenna elements. This antenna section forms the actual receiving surface for the magnetic resonance signal. Moreover, the coupler antenna parts each have a second antenna section that protrudes (preferably at a right angle) from the antenna plane. In a coupled arrangement of the coupler antenna parts, in which they form the common boundary antenna element, the two antenna sections are positioned at a predetermined distance, preferably substantially parallel, from one another. These two antenna sections thus form the actual coupler section that provides for a strong coupling of the two-coupler antenna parts to one another.

The first antenna section of a coupler antenna part preferably overlaps with the adjacent antenna elements of the appertaining antenna group, for inductive decoupling of the adjacent antenna elements in a predetermined region.

A number of such antenna groups (which cooperate to assemble an inventive antenna arrangement, and each have at least one coupler antenna part that can be coupled with a corresponding coupler antenna part of another antenna group to form a common boundary antenna element) form a magnetic resonance system that can be universally used in a wide range of applications. The antenna groups can be assembled modularly simply by being placed together and, as necessary, fastened to any antenna surfaces.

The individual antenna groups have at least two coupler antenna parts in order to couple the antenna group with at least two further antenna groups. If the coupling ensues via coupler antenna parts of two different cooperating types, an antenna group preferably has both a coupler antenna part of the first type and a coupler antenna part of the second type. When the coupler antenna parts are arranged at different (for example, opposite) edges of the appertaining antenna group, the individual antenna groups can be coupled like a chain, in order to form large general arrangements.

Such a magnetic resonance antenna system can in principle be used in any arbitrary resonance device that presently operates with surface antenna modules according to the above-described prior art.

DESCRIPTION OF THE PREFERRED EMBODIMENTS

Figure 1:
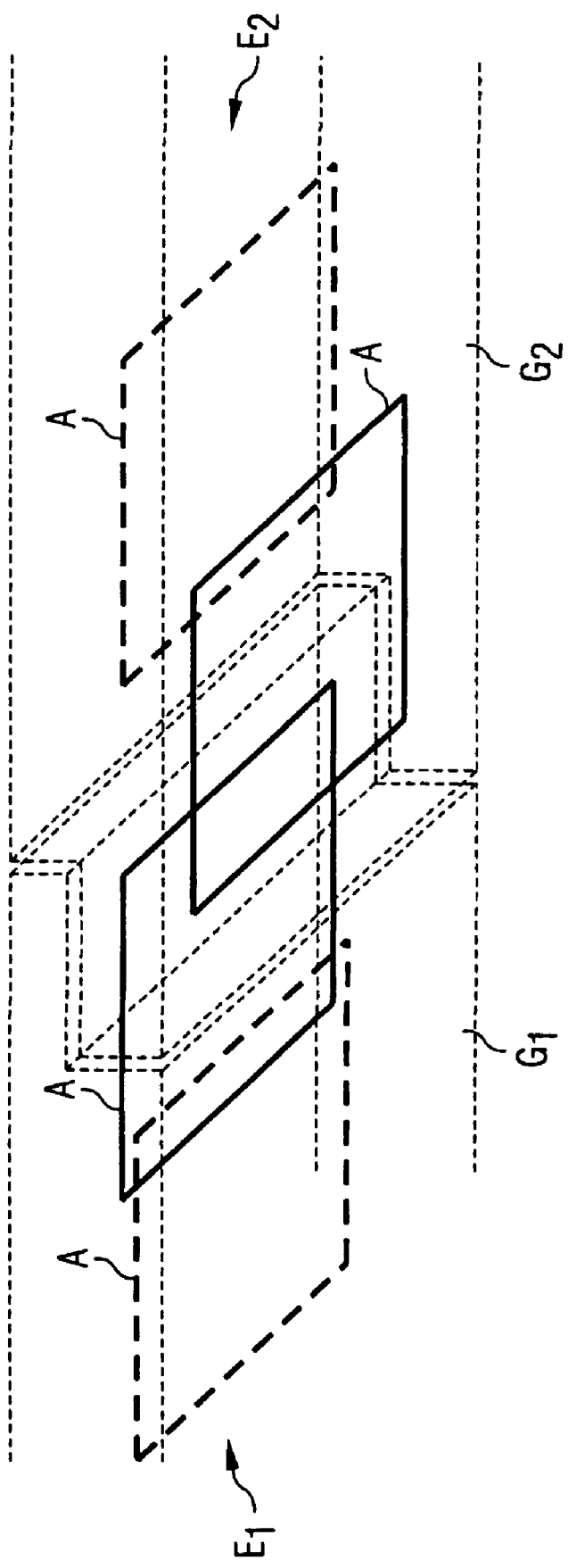
FIG. 1 is a schematic representation of the coupling of two antenna groups according to the prior art by overlapping the edge antenna elements.
Figure 2:
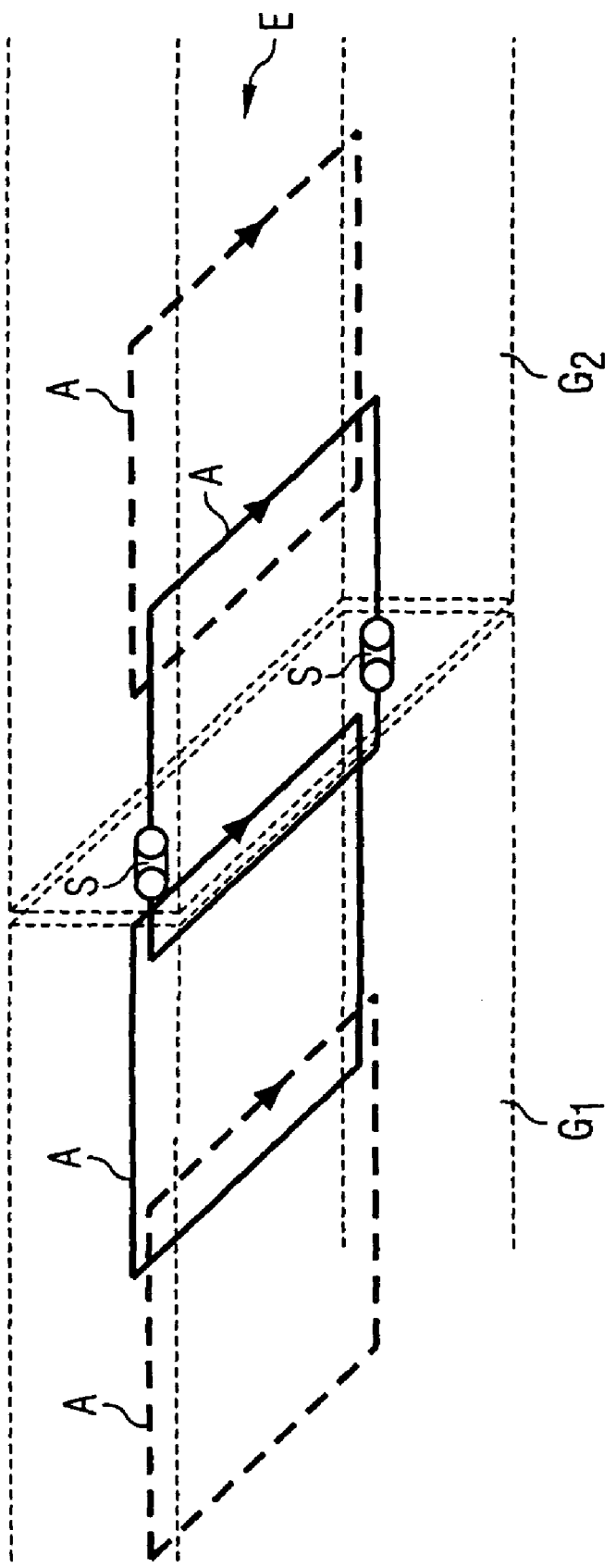
FIG. 2 is a schematic arrangement of the coupling of two antenna groups according to the prior art with the use of electrical plug contacts.

FIGS. 1 and 2 respectively show various practiced methods to couple with one another two separate antenna groups that are located in different housings $G_1$, $G_2$. The exact coupling methods, as well as their disadvantages, were already specified in detail above.

Figure 3:
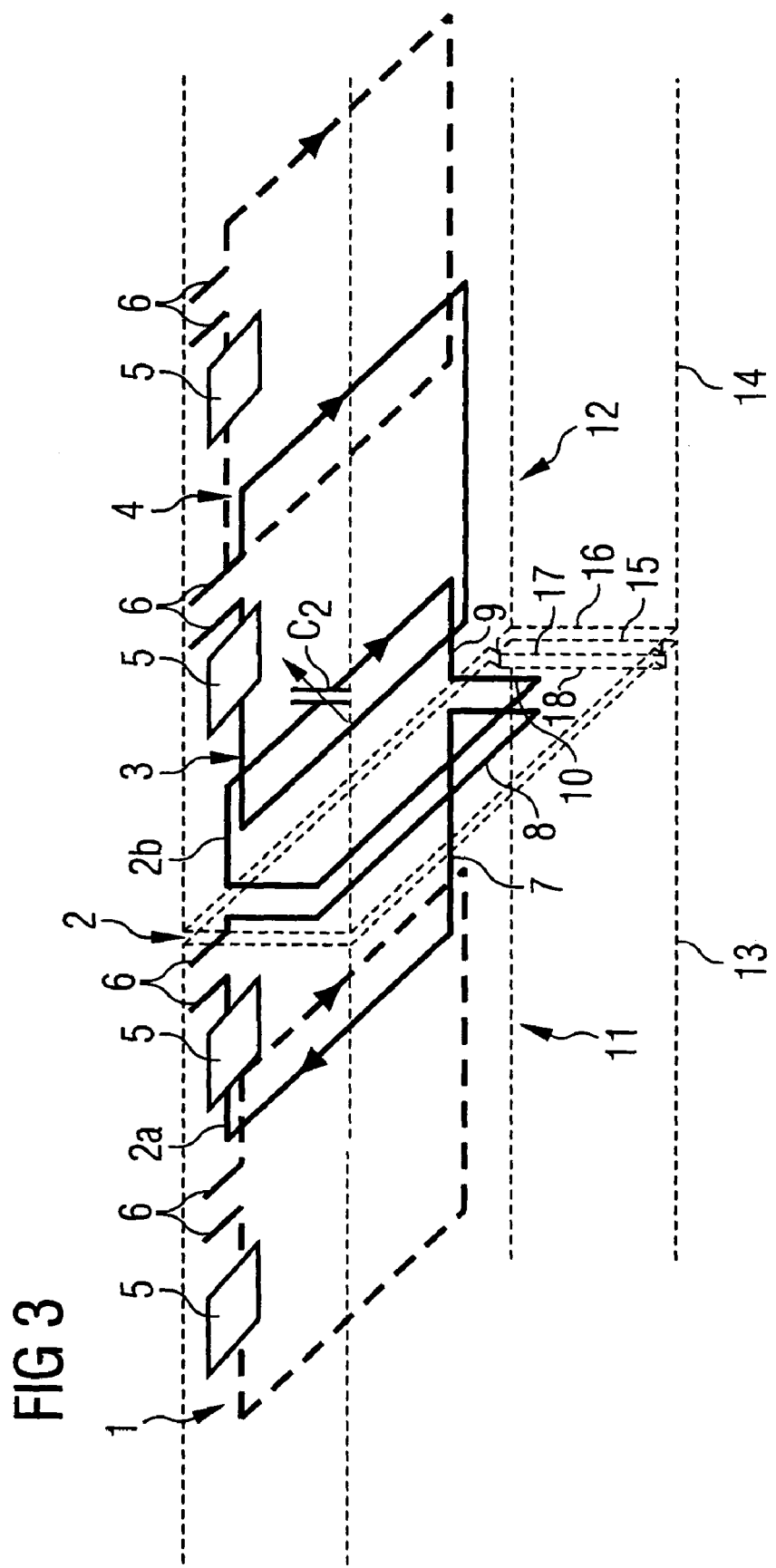
FIG. 3 is a schematic representation of the coupling of two antenna groups with the use of the inventive coupler antenna parts.

As shown in FIG. 3, coupler antenna parts 2a, 2b (which are respectively associated with one of the two antenna groups 11, 12) are used in the inventive antenna arrangement to couple the antenna groups. The antenna groups 11, 12 are formed by a field of individual antenna elements 1, 3, 4.

FIG. 3 illustrates the inside of the left antenna group 11, with only one antenna element 1 and one coupler antenna part 2a being shown for better clarity, as well as two antenna elements 3, 4 and one coupler antenna part 2b in the right antenna group 12. Typically, an antenna group includes further antenna elements which can again terminate in the shown left antenna group 11 at the far left antenna element 1 and in the right antenna group 12 at the far right antenna element 4. However, in principle an antenna group can also include only one antenna element and one coupler antenna part to couple with other antenna groups.

The individual antenna elements 1, 3, 4 here each include a detuning circuit 5 in order to tune the self-resonant frequency of the appertaining antenna element antenna elements 1, 3, 4 to the frequency of the magnetic resonance signal to be received in the reception mode, and to detune with regard to this magnetic resonance frequency in the transmission mode. It is therefore ensured that the antenna elements 1, 3, 4 only acquire signals in the reception mode and are transparent to the transmission field in the transmission mode.

The antenna groups 11, 12 each are arranged at the same height within their housings 13, 14, such that they are located substantially in an antenna plane E when the housing housings 13, 14 are placed together. The term "antenna plane" also encompasses configurations wherein the conductor loops of the antenna element 1, 3, 4 are arranged in two parallel planes, adjoining or lying a short distance from one another, that are adjacent to or overlapping one another. A typical example is the assembly of the antenna elements by means of conductor paths on a multilayer circuit board or multilayer conductor path film. The antenna plane can also be adapted in arbitrary form to an antenna housing and/or other environmental conditions, for example the body of the patient, meaning for example also wound around a cylinder or alternatively curved.

The coupler antenna parts 2a, 2b of the antenna groups 11, 12 are each located at the edges 15, 16 facing one another of the housings 13, 14. A coupler antenna part 2a of a first type (called the first coupler antenna part 2a in the following) is located in the left shown antenna group 11, and a coupler antenna part 2b of a second type (called the second coupler antenna part 2b in the following) is located in the right shown antenna group 12.

Both coupler antenna parts 2a, 2b have a first antenna section 7, 9, which proceeds substantially in the antenna plane E. Attached to it is a second antenna section 8, 10, running perpendicular to the antenna plane E, which protrudes downwardly from the antenna plane E.

The second antenna sections 8, 10 lie parallel to one another in the shown coupled state of both antenna groups 11, 12. The first antenna sections 7, 9 in the antenna plane E overlap with the respective appertaining adjacent antenna elements 1, 3.

As is later shown individually, given a suitable formation and arrangement of the two coupler antenna parts 2a, 2b, as well as the correct selection of the value of a capacitor $C_2$ connected within the second coupler antenna parts 2b, the two coupler antenna parts 2a, 2b form a common boundary antenna element 2 which receives magnetic resonance signals exactly like the other antenna elements 1, 3, 4, and is decoupled in the same manner by the overlap in the first antenna sections 7, 9 of the adjacent antenna elements 1, 3.

The second coupler antenna part 2b has no galvanic contact to any measurement device, ground potential, or the like. It is solely inductively coupled with the adjacent antenna elements 3 of its own antenna group 12 as well as in the coupled arrangement according to FIG. 3 with the first coupler antenna part 2a in the left antenna group 11 as well as to the antenna element 1 adjacent thereto.

In contrast, the first coupler antenna part 2a has a tap 6 in order to tap a magnetic resonance signal that would be received by the boundary antenna element 2 formed by the two coupler antenna parts 2a, 2b. In addition, this first coupler antenna part 2a, exactly like the remaining antenna elements 1, 3, 4, has a detuning circuit 5 in order to tune the boundary antenna element 2 as a whole to the frequency of the magnetic resonance signal to be received in the reception mode, and to detune with regard to the magnetic resonance signal in the transmission mode. Both the coupler antenna part 2a of the first type and the coupler antenna part 2b of the second type typically exhibit a self-resonant frequency that is detuned with regard to the magnetic resonance frequency.

So that both coupler antenna parts 2a, 2b in the arrangement shown in FIG. 3 function as a common boundary antenna element, it is initially required that the current be approximately the same in both coupler antenna parts 2a, 2b. This means that the current $I_{2b}$ on the second coupler antenna part 2b must correspond (as the case may be, except for a small, negligible coupler current) to the current $I_{2a}$ on the first coupler antenna part 2a. This requirement can be fulfilled by suitable selection of the value of the capacitor $C_2$.

Figure 4:
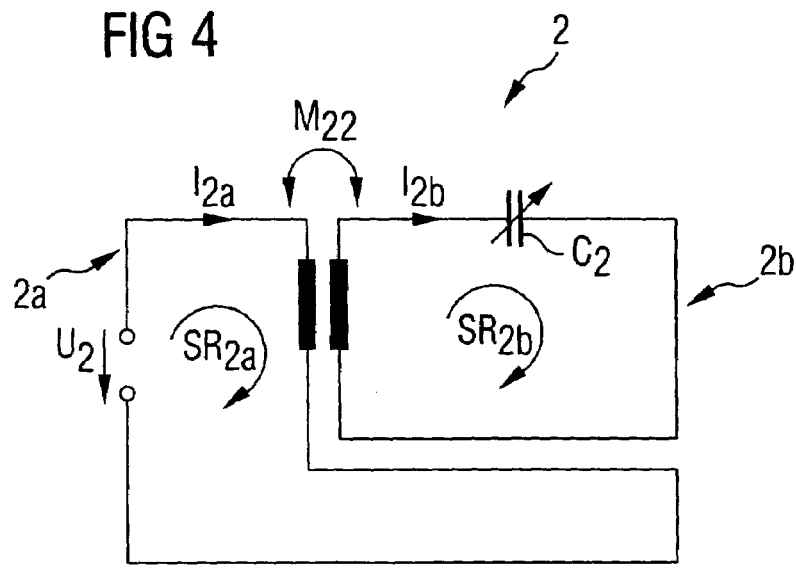
FIG. 4 is a simplified equivalent circuit diagram of the coupler antenna parts according to FIG. 3 isolated from adjacent antenna elements.

For this, reference is first made to the equivalent circuit diagram shown in FIG. 4, in which both coupler antenna parts 2a, 2b are isolated, meaning that they are considered without the influence of the adjacent antenna element 1, 3. In addition to the high-frequency currents $I_{2a}$ and $I_{2b}$ on the two-coupler antenna parts 2a, 2b and the current directions $SR_{2a}$, $SR_{2b}$, a gate voltage $U_2$, which represents the voltage at the tap 6 given reception of a magnetic resonance signal, is also shown at the first coupler antenna part 2a. In addition, the inductive coupling between the two-coupler antenna parts 2a, 2b is schematically shown by the mutual inductance $M_{22}$. Due to the existing mutual inductance $M_{22}$, the current $I_{2a}$ in the first coupler antenna part 2a induces a current $I_{2b}$ in the second coupler antenna part 2b. The level and the direction of the current $I_{2b}$ is substantially determined by the capacitor $C_2$ connected in the coupler antenna part 2b.

In order to determine the value of this capacitor $C_2$, at which the requirement is fulfilled that the currents 12a and $I_{2b}$ are approximately the same magnitude in both coupler antenna parts 2a, 2b, the mesh equations for the equivalent circuit diagram according to FIG. 4 provide a starting point:

Mesh 2a:

$$I_{2a} \cdot j\omega L_{2a} - I_{2b} \cdot j\omega M_{22} = U_2 \qquad (1a)$$

Mesh 2b:

$$-I_{2a} \cdot j\omega M_{22} + I_{2b} \cdot \left(j\omega L_{2b} + \frac{1}{j\omega C_2}\right) = 0 \qquad (1b)$$

$L_{2a}$ and $L_{2b}$ are the respective inductances of the two coupler antenna parts 2a, 2b, $\omega$ is the angular frequency of the high-frequency current (i.e. the frequency of the magnetic resonance signal to be received, and j designates an imaginary number.

In order to determine the desired capacitance of the capacitor $C_2$, the ideal condition can be established in a rudimentary fashion, normally that the currents $I_{2a}$, $I_{2b}$ are exactly the same in both coupler antenna parts 2a, 2b. This means the condition $I_{2a} = I_{2b} = I_2$ can be used. From this the equation (1a) becomes:

$$-I_2 \cdot j\omega M_{22} + I_2 \cdot \left(j\omega L_{2b} + \frac{1}{j\omega C_2}\right) = 0 \qquad (2)$$

By solving this equation for $C_2$, one obtains:

$$C_2 = \frac{1}{\omega^2 (L_{2b} - M_{22})} \qquad (3)$$

Equation (3) consequently specifies the condition for the capacitance of $C_2$ at which the currents $I_{2a}$, $I_{2b}$ are equal in the isolated ideal case.

It should be noted that, due to the minus sign in the denominator of the equation (3), the necessary value of the capacitor $C_2$ can also be negative. An inductive component would then have to be used, or the capacitor would have to be replaced by a suitable coil. However, since inductors have lesser quality than comparable capacitors, a capacitor is preferably used. It is therefore preferably insured that the inductance $L_{2b}$ of the second coupler antenna part 2b is always larger than the mutual inductance $M_{22}$ between the two coupler antenna parts 2a, 2b. This is, as a rule, easily possible by a suitable arrangement and embodiment of the coupler antenna parts 2a, 2b.

Given known values for the inductance of the second coupler antenna part 2b, as well as the coupler inductance $M_{22}$, it would be possible to precisely calculate the capacity $C_2$. In reality, this inductance as well as the coupler inductance can be determined only with difficulty. Therefore, in the design phase a variable capacitor is used in an isolated assembly of both coupler antenna parts and is adjusted until the currents $I_{2a}$, $I_{2b}$ on both coupler antenna parts 2a, 2b are equal. The capacitance of $C_2$ found in this manner can then be realized in the later serial production with a fixed capacitor.

Additionally, in order to achieve a sufficient inductive decoupling of the common boundary antenna element 2, formed by the coupler antenna parts 2a, 2b from the adjacent antenna elements 1, 3, it is necessary to overlap both coupler antenna parts $I_{2a}$, $I_{2b}$ in a suitable manner with the appertaining adjacent antenna elements 1, 3.

How the decoupling can be implemented by this overlap is shown in the following. It is sufficient, as an example, to describe the decoupling between the boundary antenna element 2 and the adjacent antenna element 3 in the right antenna group 12. The decoupling from the adjacent antenna element 1 in the left antenna group 11 ensues in a similar manner.

Figure 5:
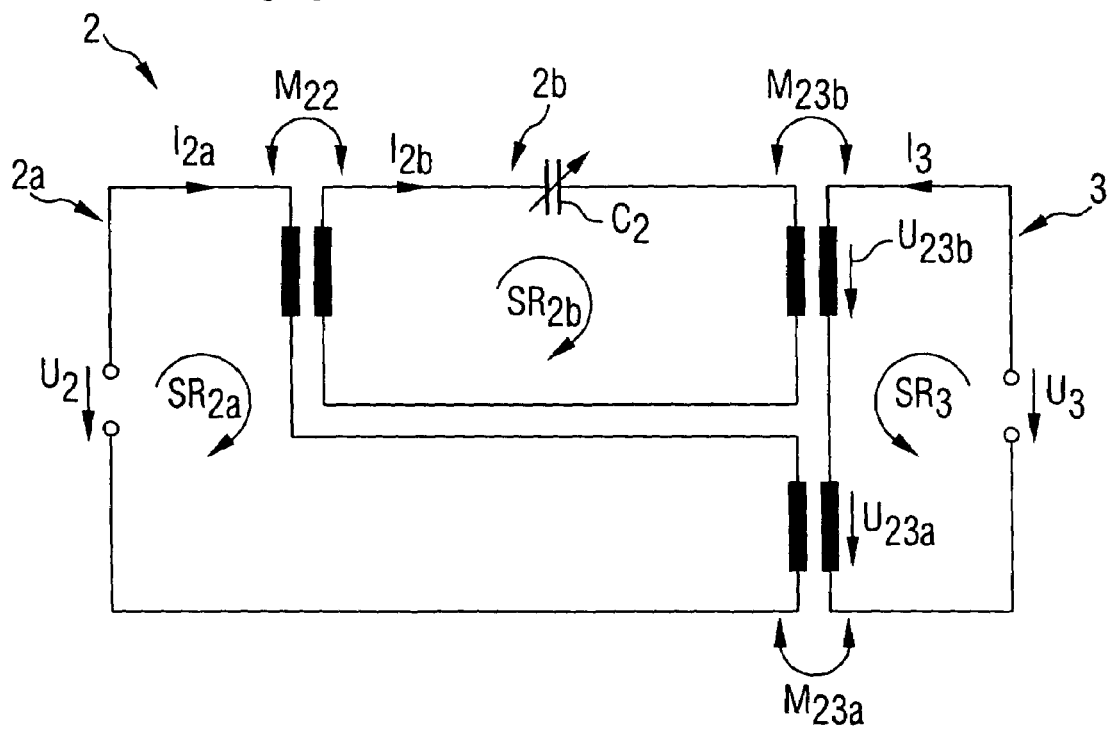
FIG. 5 is a simplified equivalent circuit diagram of the coupler antenna parts according to FIG. 4 with regard to an adjacent antenna element.

For this, reference is made to the equivalent circuit diagram of these components in FIG. 5. The components shown in FIG. 5 are indicated in FIG. 3 with continuous lines, in contrast to which disregarded antenna elements are shown dashed in this equivalent circuit diagram. In this second equivalent circuit diagram, in addition to the parameters specified in the equivalent circuit diagram according to FIG. 4, the high-frequency current $I_3$ and the current direction $SR_3$ on adjacent antenna element 3 are shown, as well as the voltage $U_3$ at the terminals of this antenna element 3. Furthermore, the mutual inductances $M_{23a}$ and $M_{23b}$ are shown between the first coupler antenna part 2a, as well as the second coupler antenna part 2b, and the antenna part 3. Additionally indicated are the voltages $U_{23a}$, $U_{23b}$ induced by the high-frequency currents $I_{2a}$, $I_{2b}$ of the coupler antenna parts 2a, 2b in the antenna element 3 due to the mutual inductances $M_{23a}$, $M_{23b}$. These voltages $U_{23a}$, $U_{23b}$ contribute to the terminal voltage $U_3$ of the antenna element 3. A decoupling is then present precisely when both over-coupled voltage parts $U_{23a}$, $U_{23b}$ mutually cancel.

The mesh equations for the equivalent circuit diagram according to FIG. 5 are here again the starting point of the calculations:

Mesh 2a:

$$I_{2a} \cdot j\omega L_{2a} + I_3 \cdot j\omega M_{23a} - I_{2b} \cdot j\omega M_{22} = U_2 \quad (4a)$$

Mesh 2b:

$$-I_{2a} \cdot j\omega M_{22} + I_3 \cdot j\omega M_{23b} + I_{2b} \cdot \left(j\omega L_{2b} + \frac{1}{j\omega C_2}\right) = 0 \quad (4b)$$

Mesh 3:

$$I_{2a} \cdot j\omega M_{23a} + I_3 \cdot j\omega L_3 + I_{2b} \cdot j\omega M_{23b} = U_3 \quad (4c)$$

If, in equation (4c), the assumption is used for the third mesh formulated above that the currents $I_{2a}$, $I_{2b}$ should be approximately equal in both coupler antenna parts 2a, 2b (i.e., that $I_{2a} \approx I_{2b} \approx I_2$ is true), then the voltage $U_3$ at the terminals of the antenna element 3 then depends precisely on the current $I_3$ on this antenna element 3 alone, when the following is true:

$$M_{23a} + M_{23b} = 0 \quad (5)$$

This is the coupling requirement that is achieved by a suitable overlap between the coupler antenna part 2b and the antenna element 3.

The decoupling requirement according to equation 5 can also be written in the following form:

$$M_{23a} = -M_{23b} = M_{23} \quad (6)$$

If the constants $M_{23a}$, $M_{23b}$ in the mesh equations (4a), (4b), (4c) are respectively replaced by the common constant $M_{23}$ according to equation 6, the result is:

$$I_{2a} \cdot j\omega L_{2a} + I_3 \cdot j\omega M_{23} - I_{2b} \cdot j\omega M_{22} = U_2 \quad (7a)$$

$$-I_{2a} \cdot j\omega M_{22} - I_3 \cdot j\omega M_{23} + I_{2b} \cdot \left(j\omega L_{2b} + \frac{1}{j\omega C_2}\right) = 0 \quad (7b)$$

$$I_{2a} \cdot j\omega M_{23} + I_3 j\omega L_3 + I_{2b} \cdot j\omega M_{23} = U_3 \quad (7c)$$

By using the condition according to equation (3) for the capacitance of $C_2$ in the equation (7b), the result is:

$$-I_{2a} \cdot j\omega M_{22} - I_3 \cdot j\omega M_{23} + I_{2b} \cdot j\omega M_{22} = 0 \quad (8)$$

By solving this equation for $I_{2b}$, one obtains:

$$I_{2b} = I_{2a} + I_3 \cdot \frac{M_{23}}{M_{22}} \approx I_{2a} \quad (9)$$

Equation (9) shows that, given the presence of the adjacent antenna element 3, the current $I_{2b}$ in the second coupler antenna part 2b does not correspond completely to the current $I_{2a}$ on the first coupler antenna part, even if the capacitance $C_2$ were to be chosen according to equation (3). A lesser decoupling current, which is specified by the second term of the middle part of the equation (9), occurs in the second coupler antenna part 2b. This decoupling current is dependent on the current 13 in the adjacent antenna elements 3. Additionally, the decoupling current is dependent on the identical coupling inductance $M_{23}$ (according to the requirement according to equation (6)) of both coupler antenna parts 2a, 2b to the aforementioned antenna element 3 with regard to the coupling inductance $M_{22}$ between the two coupler antenna parts 2a, 2b.

The coupling inductance $M_{22}$ between the coupler antenna parts 2a, 2b is set to be relatively strong. It is here a resonance coupling. Given a received magnetic resonance signal, modes form in the boundary antenna 2 formed from the coupler antenna parts 2a, 2b. In one mode, the currents flow in the same direction. This is known as the synchronous resonance mode, which is implemented at the desired magnetic resonance frequency given a tuning of the boundary antenna element 2 with the detuning device 5. The second mode, in which the currents flow in opposite directions, is in contrast uninteresting for the present application.

In contrast, the coupling inductance $M_{23}$ given by the inductive coupling between the coupler antenna parts 2a, 2b and the adjacent antenna element 3 is relatively small. It is significantly below 10% of the coupling inductance $M_{22}$ between the coupler antenna parts 2a, 2b between each other.

Since the internal coupling inductance $M_{22}$ is implemented significantly larger than the coupling inductance $M_{23}$ between the coupler antenna parts 2a, 2b and the adjacent antenna element 3, the decoupler current portion in equation (9) in relation to the current $I_{2a}$ on the first coupler antenna part 2a is negligible.

By using the equation (9) in equation (7a), one obtains for the requirements within the first coupler antenna part 2a:

$$I_{2a} \cdot j\omega L_{2a} - I_{2a} \cdot j\omega M_{22} = U_2 \tag{10}$$

This equation shows that the gate voltage $U_2$ of the first coupler antenna part 2a no longer depends on current 13 on the antenna element 3 adjacent to the second coupler antenna part 2b. A decoupling in this direction is thus achieved.

By using the equation (9) in equation (7c), one obtains the following for the conditions within the adjacent antenna element 3:

$$I_3 \cdot j\omega L_3 - I_3 \cdot j\omega \frac{M_{23}^2}{M_{22}} = U_3 \approx I_3 \cdot j\omega L_3 \tag{11}$$

This equation shows that the terminal voltage $U_2$ of the adjacent antenna element 3 now depends only on the current $I_3$ on this antenna element 3, and no longer depends on currents $I_{2a}$, $I_{2b}$ on the coupler antenna parts 2a, 2b. A decoupling in this direction is thus also achieved.

The coupler antenna parts 2a, 2b only have influence on the antenna element 3, inasmuch that the "normal" impedance $j\omega L_3$ is somewhat decreased by the addition $j\omega(M_{23}^2/M_{22})$. Since the coupling inductance $M_{23}$ between the coupler antenna parts 2a, 2b and the adjacent antenna element 3 is significantly less than the internal coupling inductance $M_{22}$ of both coupler antenna parts 2a, 2b among each other, this change in impedance is also negligible in practice.

Given a design of the antenna groups with the appertaining coupler antenna parts 2a, 2b, the requirements can be achieved by initially both coupler antenna parts 2a, 2b being assembled isolated, with the capacitance of $C_2$ being adjusted by a variable capacitor until the current is equal in both coupler antenna parts 2a, 2b. In a second step, the overlap between the second coupler antenna part 2b and the antenna element 3 can then be changed thus until the voltage $U_3$ at the terminals of the antenna element 3 is zero in spite of a supplied voltage at the terminals of the first coupler antenna part 2a. In this case, a decoupling exists. In the same manner, an antenna element can also be attached on the other side, i.e. adjacent to the coupler antenna part 2a.

The coupler antenna parts 2a, 2b and the antenna elements 1, 3, 4 are respectively arranged inside the housings 13, 14 such that the coupler antenna parts 2a, 2b are automatically located in the correct position with respect to one another when the housings 13, 14 are suitably placed with their edge surfaces 15, 16 one in front of the other. As a positioning aid, grooves 18 and tongues 17 fitting one another are disposed at these edge surfaces 15, 16 that interlock as soon as the housings 13, 14 are suitably placed one in front of the other. Alternatively, the antenna housings 13, 14 can have other positioning aids, for example interlocking pins and holes, position markings, or the like.

The antenna groups 12, 11 each have at their other ends (not shown), a suitable coupler antenna part 2a, 2b, whereby the antenna group 11 shown on the left in FIG. 3 having a second coupler antenna part 2b, and the antenna group shown on the right in FIG. 3 having at its end a first coupler antenna part 2a. The individual antenna groups 11, 12 thus can be arbitrarily circuited as antenna modules like a chain one after the other, with the appertaining housings 13, 14 simply being placed together.

At this point, it is once again noted the above-described assembly is only an exemplary embodiment, and the basic principle of the coupling of two antenna groups by means of the inventive coupler antenna parts can be modified in further fields by those skilled in the art.

In particular, the proportions of both coupler antenna parts 2a, 2b can be shown other than as in FIG. 3. For example, the first antenna section 9 of the second coupler antenna part 2b lying in the antenna plane E can be significantly longer, in order to implement at the same value the coupling inductance $M_{23a}$ between the first coupler antenna part 2a and the adjacent antenna element 3, as well as the coupling inductance $M_{23b}$ of the inductive coupling between the second coupler antenna part 2b itself and the antenna element 3 adjacent to it.

Furthermore, in addition to the shown antenna elements arranged in a row, an antenna group can include still further antenna elements that are located in one or even more rows proceeding parallel to the shown row. In this case, corresponding coupler antenna parts 2a, 2b are again likewise located at the appertaining rows, in order to suitably decouple these rows of antenna elements.

Likewise, the individual antenna elements of an antenna group can be positioned relative to one another in arbitrary other arrangements, whereby the coupler antenna parts must then likewise be suitably adapted.

Although modifications and changes may be suggested by those skilled in the art, it is the intention of the inventor to embody within the patent warranted hereon all changes and modifications as reasonably and properly come within the scope of his contribution to the art.

I claim as my invention:

1. An antenna arrangement for a magnetic resonance apparatus comprising:
   a first antenna group including at least one first group antenna element;
   a second antenna group, in adjacent relationship to said first antenna group but separated from said first antenna group, including at least one second group antenna element said first and second antenna groups being simultaneously active; and
   a first group coupler antenna part in said first antenna group and a second group coupler antenna part in said second antenna group, said first group coupler antenna part and said second group coupler antenna part interacting with each other due to said adjacent relationship of said first and second antenna groups to form, by inductive coupling, a common boundary antenna element of said first and second antenna groups, said common boundary antenna element being inductively decoupled from said at least one first group antenna element and said at least one second group antenna element.

2. An antenna arrangement as claimed in claim 1 comprising a reactive component, selected from the group consisting of capacitive components and inductive components, connected in at least one of said first group coupler antenna part and said second group coupler antenna part, said reactive component having a value that equalizes respective currents in said first group coupler antenna part and said second group coupler antenna parts, if said boundary antenna element were isolated from said at least one first group antenna element and said at least one second group antenna element.

3. An antenna arrangement as claimed in claim 2 wherein said reactive component is variable to equalize said respective currents.

4. An antenna arrangement as claimed in claim 1 wherein said first group coupler antenna part and said second group coupler antenna part are configured to equalize respective magnitudes of respective coupling inductances between one of said first group coupler antenna part and said second group coupler antenna part, and one of said at least one first group antenna element and said at least one second group antenna element, and between the other of said first group coupler antenna part and said second group coupler antenna part and said one of said at least one first group antenna element and said at least one second group antenna element.

5. An antenna arrangement as claimed in claim 4 comprising a reactive component, selected from the group consisting of capacitive components and inductive components, connected in at least one of said first group coupler antenna part and said second group coupler antenna part, said reactive component being variable to equalize said respective magnitudes of said respective coupling inductances.

6. An antenna arrangement as claimed in claim 1 wherein said first group coupler antenna part comprises a coupler antenna part of a first type, and wherein said second group coupler antenna part comprises a coupler antenna part of a second type, and wherein said common boundary antenna element comprises a single coupler antenna part of said first type and a single coupler antenna part of said second type.

7. An antenna arrangement as claimed in claim 1 wherein said first and second antenna groups are adapted to receive a magnetic resonance signal having a frequency, and wherein said first group coupler antenna part and said second group coupler antenna part are configured to have a self-resonant frequency that is detuned with respect to said frequency of said magnetic resonance signal.

8. An antenna arrangement as claimed in claim 1 wherein said first and second antenna groups are adapted to transmit a signal in a transmission mode and to receive a magnetic resonance signal, having a frequency, in a reception mode, and wherein at least one of said first group coupler antenna part and second group coupler antenna part comprises a tuning device which tunes a self-resonant frequency of said boundary antenna element to said frequency of said magnetic resonance signal in said reception mode, and detunes said self-resonant frequency of said boundary antenna element with respect to said frequency of said magnetic resonance signal in said transmission mode.

9. An antenna arrangement as claimed in claim 7 wherein at least one of said first group coupler antenna part and second group coupler antenna part comprises a tuning arrangement to tune the self-resonant frequency of the coupler antenna part comprising the tuning device to said frequency of said magnetic resonance signal, without the other of said first group coupler antenna part and second group coupler antenna part being coupled thereto.

10. An antenna arrangement as claimed in claim 1 wherein each of said first group coupler antenna part and said second group coupler antenna part comprises a first antenna section proceeding substantially in an antenna plane formed by said at least one first antenna element and said at least one second antenna element, and a second antenna section that protrudes from said antenna plane, the respective second antenna sections of said first group coupler antenna part and said second group coupler antenna part being disposed at a predetermined distance from each other.

11. An antenna arrangement as claimed in claim 9 wherein said first antenna section of said first group coupler antenna element overlaps with said at least one first group antenna element and wherein said first antenna section of said second group coupler antenna part overlaps with said at least one second group antenna element, to inductively decouple said at least one first group antenna element and said at least one second group antenna element from each other.

12. An antenna arrangement as claimed in claim 1 wherein at least one of said first group and second group coupler antenna parts is galvanically contact-free.

13. An antenna arrangement as claimed in claim 1 comprising a first housing containing said first antenna group and a second housing, separate from said first housing, containing said second antenna group, said first housing and said second housing being positionable in a plane relative to each other to automatically configure said first group coupler antenna part and said second group coupler antenna part to produce said inductive coupling to form said common boundary antenna element.

14. An antenna arrangement as claimed in claim 13 wherein said first antenna housing and said second antenna housing respectively comprise cooperative positioning elements to cause said antenna housings to be positioned relative to each other to automatically cause said first group coupler antenna part and said second group coupler antenna part to produce said inductive coupling to form said common boundary antenna element.

15. An magnetic resonance antenna system comprising:
a plurality of antenna groups, including at least a first antenna group having at least one first group antenna element and a second antenna group having at least one second group antenna element, each of said antenna groups in said plurality of antenna groups being separated from each other;
said first antenna group including a first group coupler antenna part and said second antenna group including a second group coupler antenna part, said first and second antenna groups being simultaneously active; and
said first antenna group and said second antenna group being selectively positionable in an adjacent relationship to configure said first group coupler antenna part and said second group coupler antenna part to inductively couple with each other to form a common boundary antenna element of said first and second antenna groups, said common boundary antenna element being inductively decoupled from said at least one first group antenna element and said at least one second group antenna element.

16. An magnetic resonance antenna system as claimed in claim 15 wherein said first group coupler antenna part comprises a coupler antenna part of a first type, and wherein said second group coupler antenna part comprises a coupler antenna part of a second type.

17. An magnetic resonance antenna system as claimed in claim 16 wherein each of said first and second antenna groups comprises a coupler antenna part of said first type and a coupler antenna part of said second type.

18. An magnetic resonance antenna system as claimed in claim 17 wherein the respective coupler antenna parts of said first type and said second type are disposed at different edges of the respective first and second antenna groups.

19. A method for coupling two simultaneously active antenna groups to acquire a magnetic resonance signal, wherein each of said antenna groups comprises at least one group antenna element and a coupler antenna part, said method comprising the steps of:

positioning the respective antenna groups relative to each other in a predetermined arrangement; and configuring the respective coupler antenna parts in the respective antenna groups so that, when said antenna groups are positioned in said predetermined arrangement, the respective coupler antenna parts are inductively coupled with each other and form a common boundary antenna element of the respective antenna groups, said common boundary antenna element being inductively decoupled from said first group antenna element and said second group antenna element.

* * * * *